(12) United States Patent
Zhang et al.

(10) Patent No.: US 11,508,644 B2
(45) Date of Patent: Nov. 22, 2022

(54) SEMICONDUCTOR DEVICE PACKAGE HAVING THERMALLY CONDUCTIVE PATHWAYS

(71) Applicant: WESTERN DIGITAL TECHNOLOGIES, INC., San Jose, CA (US)

(72) Inventors: Yazhou Zhang, Shanghai (CN); Shineng Ma, Shanghai (CN); Kent Yang, Hsinchu (TW); Hope Chiu, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/186,646

(22) Filed: Feb. 26, 2021

(65) Prior Publication Data

US 2022/0216128 A1 Jul. 7, 2022

Related U.S. Application Data

(60) Provisional application No. 63/134,402, filed on Jan. 6, 2021.

(51) Int. Cl.
*H01L 23/433* (2006.01)
*H01L 25/065* (2006.01)
*H01L 23/00* (2006.01)
*H01L 21/311* (2006.01)
*H01L 21/56* (2006.01)
*H01L 21/3065* (2006.01)

(52) U.S. Cl.
CPC ...... *H01L 23/4334* (2013.01); *H01L 21/3065* (2013.01); *H01L 21/311* (2013.01); *H01L 21/56* (2013.01); *H01L 24/16* (2013.01); *H01L 24/32* (2013.01); *H01L 24/48* (2013.01); *H01L 24/73* (2013.01); *H01L 25/0652* (2013.01); *H01L 2224/16225* (2013.01); *H01L 2224/32225* (2013.01); *H01L 2224/48225* (2013.01); *H01L 2224/73204* (2013.01)

(58) Field of Classification Search
CPC . H01L 23/4334; H01L 21/3065; H01L 21/311
See application file for complete search history.

(56) References Cited

U.S. PATENT DOCUMENTS

2014/0063742 A1* 3/2014 Carpenter, Jr ...... H01L 23/4334
361/705

\* cited by examiner

*Primary Examiner* — Errol V Fernandes
(74) *Attorney, Agent, or Firm* — Morgan, Lewis & Bockius LLP (57) ABSTRACT

A semiconductor device package includes a substrate, a first heat-generating component positioned on a surface of the substrate, an encapsulant at least partially encapsulating the first heat-generating component, and one or more channels extending through a portion of the encapsulant toward the first heat-generating component. Each of the one or more channels contains a thermally conductive material having a thermal conductivity greater than a thermal conductivity of the encapsulant.

19 Claims, 4 Drawing Sheets

SEMICONDUCTOR DEVICE PACKAGE HAVING THERMALLY CONDUCTIVE PATHWAYS

CROSS-REFERENCE TO RELATED APPLICATION(S)

This application claims priority to and the benefit of U.S. Provisional Application No. 63/134,402, filed Jan. 6, 2021, which is incorporated herein by reference in its entirety.

BACKGROUND

The present disclosure provides a semiconductor device package having an encapsulant and one or more thermally conductive pathways extending through the encapsulant for improved thermal dissipation. In some embodiments, the present disclosure further relates to methods for producing a semiconductor device package having one or more thermally conductive pathways.

Encapsulants are materials that are utilized to encapsulate and protect an integrated circuit (IC) die and/or other components of a semiconductor package. Encapsulants may include, for example, ceramic, glass, thermoplastic materials, thermoset resins, or composites thereof. Some commonly used encapsulants include epoxy mold compounds (EMCs) that typically contain a mixture of epoxy resins and one or more additives (e.g., curing agents, hardeners, accelerators, fillers, flame retardants, adhesion promoters, and/or pigments). The encapsulant may be applied, for example, by melting a quantity of the encapsulant and injecting the liquefied material into a mold cavity that surrounds the IC die and/or other components to be encapsulated. The liquefied material is allowed to cover the components and is then cured or hardened around the components.

Encapsulants may have relatively low thermal conductivity, resulting in poor transmission of heat from the encapsulated components. For example, some EMC materials may have a thermal conductivity of about 1.0 W/m·K or lower. Accordingly, excess heat generated by the IC die and other electronic components of the semiconductor device may not be effectively dissipated, decreasing reliability of the semiconductor device and possibly resulting in premature failure. It would therefore be advantageous to have a semiconductor device package with improved thermal dissipation through the encapsulant.

SUMMARY

The present disclosure, according to some embodiments, provides a semiconductor device package with one or more thermally conductive pathways and methods for making the same. In some embodiments, the semiconductor device package includes one or more channels in the encapsulant that are configured to contain or be filled with a thermally conductive material, for example, a thermally conductive metal or metal alloy. In some embodiments, the one or more channels extend through a portion of the encapsulant toward a heat-generating component of the semiconductor device package (e.g., an IC die, NAND die, etc.). In some embodiments, the one or more channels extend from a surface of the encapsulant to a surface of the heat-generating component.

In some embodiments, a semiconductor device package according to the present disclosure includes a substrate, a first heat-generating component positioned on a surface of the substrate, an encapsulant at least partially encapsulating the first heat-generating component, and one or more channels extending through a portion of the encapsulant toward the first heat-generating component, each of the one or more channels containing a thermally conductive material having a thermal conductivity greater than a thermal conductivity of the encapsulant.

In some embodiments, each of the one or more channels extends from a surface of the encapsulant to a surface of the first heat-generating component. In some embodiments, each of the one or more channels extends at least partially into the first heat-generating component. The first heat-generating component may be, for example, an integrated circuit die. In some embodiments, the first heat-generating component is a flip-chip die. In some embodiments, the one or more channels extend into the back side of the integrated circuit die. In some embodiments, the channels may extend through 1% to more than 50% of a thickness of the integrated circuit die (e.g., at least 10%). In some embodiments, the thermally conductive material extends an entire length of the one or more channels and is in physical contact with the first heat-generating component. In some embodiments, the thermally conductive material has a thermal conductivity greater than 150 W/m·K (e.g., from about 300 W/m·K to about 500 W/m·K). In some embodiments, the thermally conductive material is a metal or metal alloy, for example, pure copper or a copper alloy.

In further embodiments, the semiconductor device package further includes a second heat-generating component positioned on the substrate. The second heat-generating component may be, for example, a NAND die or other memory die. In some such embodiments, the semiconductor device package may further includes a second set of channels extending through a second portion of the encapsulant toward the second heat-generating component, each channel of the second set of channels also containing a thermally conductive material having a thermal conductivity greater than a thermal conductivity of the encapsulant. In some embodiments, the channels of the second set of channels are separated from the second heat-generating component (e.g., by a thin layer of encapsulant). In yet further embodiments, the semiconductor device package may include a thermally conductive coating on a surface of the encapsulant. In some embodiments, the thermally conductive coating is in contact with the thermally conductive material contained in the channels.

In further embodiments, a semiconductor device package includes a substrate means for providing electrical interconnections, an integrated circuit die attached to a surface of the substrate means, wherein the integrated circuit die includes contact means for electrically connecting the integrated circuit die with the substrate means, an encapsulation means for at least partially encapsulating the integrated circuit die, and a first thermal conduction means for passively conducting heat generated by the integrated circuit die through the encapsulation means, the first thermal conduction means extending at least partially into the integrated circuit die. In some embodiments, the semiconductor device package further includes a memory die attached to the surface of the substrate means, and a second thermal conduction means for passively conducting heat generated by the memory die through the encapsulation means. In some embodiments, the semiconductor device package includes a surface treatment means on a surface of the encapsulation means for dissipating heat from the semiconductor device package to a surrounding environment, the surface treatment means being in contact with the first and/or second thermal conduction means.

A method for manufacturing a semiconductor device package according to certain embodiments includes the steps of: positioning an integrated circuit die on a substrate, the integrated circuit die having an active side facing the substrate and a back side opposite the active side, encapsulating the integrated circuit die with an encapsulant, etching or drilling one or more channels through a portion of the encapsulant, the one or more channels extending from a surface of the encapsulant toward a surface of the integrated circuit die, and filling the one or more channels with a thermally conductive material having a thermal conductivity greater than a thermal conductivity of the encapsulant. In some embodiments, the thermally conductive material comprises a metal or metal alloy, and filling the one or more channels with the thermally conductive material comprises electroplating the metal or metal alloy in the one or more channels.

In some embodiments, the one or more channels extend from the surface of the encapsulant to the back side of the integrated circuit die. In some embodiments, the method further includes etching the back side of the integrated circuit die to extend the one or more channels through a portion of the integrated circuit die prior to filling the one or more channels with the thermally conductive material. In some embodiments, reactive ion etching may be used to etch the back side of the integrated circuit die. In some embodiments, the method further includes coating the surface of the encapsulant with a thermally conductive coating, the thermally conductive coating being in contact with the thermally conductive material. The coating may be a metallic coating applied, for example, by electroplating or sputtering.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
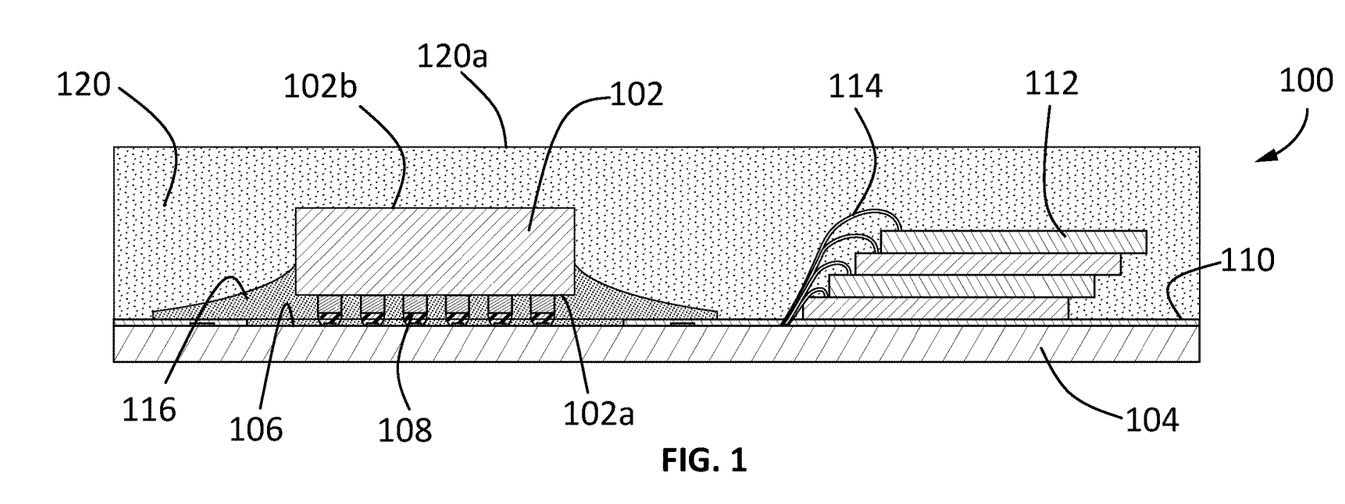
FIG. 1 is a cross-sectional side view of a portion of a conventional semiconductor device package having an IC die positioned on a substrate and encapsulated by an encapsulant.

FIG. 1 is a diagram illustrating a portion of a conventional semiconductor device package 100. Semiconductor device package 100 includes, for example, an IC die 102 (e.g., a flip-chip die) that is positioned on a surface 106 of substrate 104. IC die 102 may be, for example, an application-specific integrated circuit (ASIC) die, in some embodiments. IC die 102 may include an active side 102a that is positioned to face substrate 104, and a back side 102b that is opposite of active side 102a and faces away from substrate 104. Substrate 104 may be a circuit board (e.g., PCB) having external circuitry to which active side 102a of IC die 102 is electrically connected, for example, via one or more solder joints 108. In some examples, substrate 104 may further include a solder mask 110 on surface 106 that is configured to electrically connect to one or more additional electronic components, for example, one or more NAND dies 112 or other memory chips. The one or more NAND dies 112 or other memory chips may be electrically connected to electrical contacts (e.g., gold fingers) via wires 114, for example. In some embodiments, particularly where IC die 102 is a flip-chip die, semiconductor device package 100 further includes an underfill material 116 that is configured to adhere IC die 102 to substrate 104. Underfill material 116, for example, may be an electrically insulating material (e.g., resin) that fills a space between IC die 102 and substrate 104.

As further illustrated in FIG. 1, one or more components of semiconductor device package 100 are encapsulated by an encapsulant 120, which helps protect the one or more components. Encapsulant 120 may include, for example, a ceramic, glass, thermoplastic, thermoset resin, or composite thereof. In some examples, encapsulant is an EMC or other encapsulating material that is molded around IC die 102 and/or NAND dies 112. Encapsulant 120, in some embodiments, further surrounds underfill material 116, solder mask 110, and/or other components on substrate 104.

During operation, electronic components of semiconductor device package 100 generate heat. These heat-generating components can include, for example, IC die 102, NAND dies 112, and any other semiconductor integrated circuits of semiconductor device package 100. As discussed, encapsulant 120 may have a relatively low thermal conductivity (e.g., less than 10 W/m·K), and therefore dissipation of excess heat away from the heat-generating components may be poor or inefficient. For example, in some instances, only about 10% to about 20% of the heat generated by IC die 102 may dissipate through top surface 120a of encapsulant 120.

Figure 2:
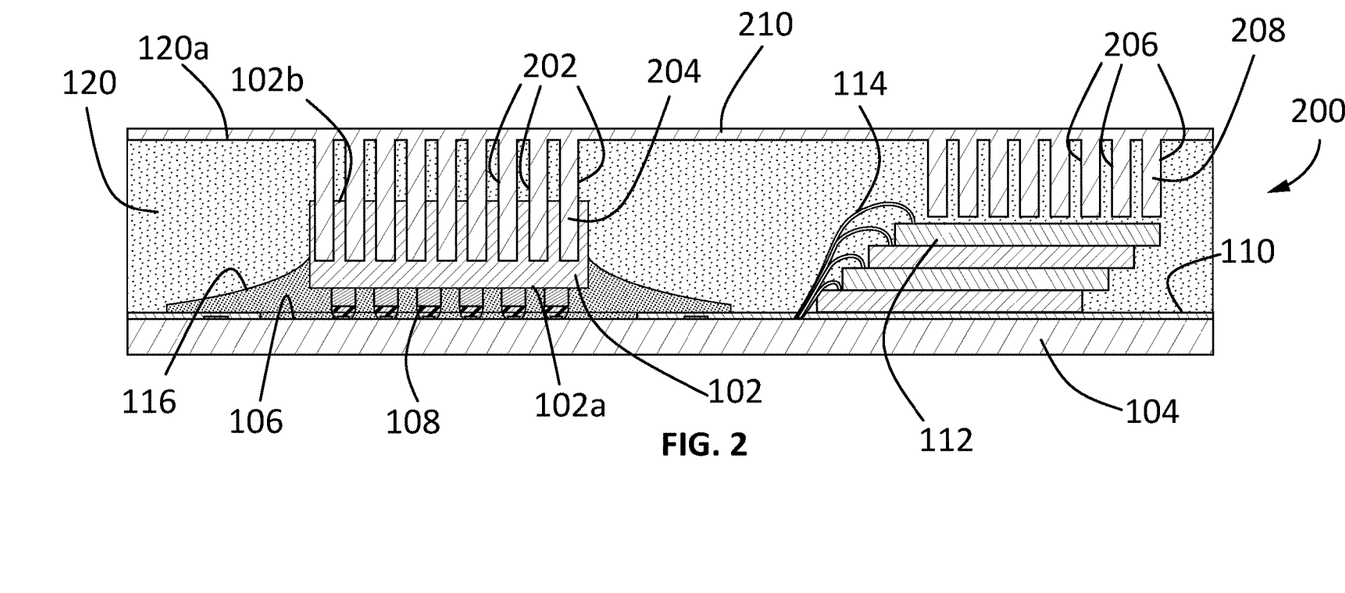
FIG. 2 is a cross-sectional side view of a portion of a semiconductor device package according to certain embodiments of the present disclosure having thermally conductive pathways for dissipating heat from the IC die.

FIG. 2 illustrates a semiconductor device package 200 according to certain embodiments of the present disclosure that is configured to provide improved heat dissipation. Semiconductor device package 200 may generally have components similar to those of semiconductor device package 100. For example, in certain embodiments semiconductor device package 200 includes at least one heat-generating component, e.g., IC die 102 (e.g., a flip-chip die), one or more NAND dies 112, and/or other chips, that are positioned on substrate 104. Semiconductor device package 200 further includes an encapsulant 120 that at least partially surrounds the one or more heat-generating components. In some embodiments, semiconductor device package 200 may further include solder mask 110, underfill material 116 that is configured to adhere IC die 102 to substrate 104, and wires 114. In these aspects, semiconductor device package 200 may be similarly configured as semiconductor device package 100.

In further embodiments, semiconductor device package 200 additionally includes one or more channels 202 that extend through a portion of encapsulant 120. In some embodiments, semiconductor device package 200 includes a plurality of channels 202. In some embodiments, the plurality of channels 202 are arranged in an array. In some embodiments, each of the one or more channels may extend from a surface of encapsulant 120 (e.g., top surface 120a) toward a heat-generating component, for example, IC die 102. In some embodiments, each of the one or more channels may extend from a surface of encapsulant 120 (e.g., top surface 120a) to a surface of the heat-generating component, for example, a surface of back side 102b of IC die 102. In yet further embodiments, some or all of the one or more channels 202 may extend at least partially into the heat-generating component (e.g., into back side 102b of IC die 102). In some embodiments, the one or more channels 202 may each extend in a direction that is perpendicular or substantially perpendicular to top surface 120a of encapsulant 120 and/or back side 102b of IC die 102. In some embodiments, the one or more channels 202 may be parallel or substantially parallel to each other.

In some embodiments, each of the one or more channels 202 is configured to contain a thermally conductive material 204 in order to provide thermally conductive pathways for dissipating heat away from the heat-generating component. In some such embodiments, the thermally conductive pathways provide passive means for dissipating heat from the heat-generating component. Thermally conductive material 204 should be selected to have a thermal conductivity that is greater than the thermally conductivity of encapsulant 120. In some embodiments, thermally conductive material 204 has a thermal conductivity that is at least 10 to at least 100 times greater than the thermally conductivity of encapsulant 120. In some embodiments, thermally conductive material 204 has a thermal conductivity that is at least 100 to at least 200 times greater than the thermally conductivity of encapsulant 120. In some embodiments, thermally conductive material 204 has a thermal conductivity that is at least 200 to at least 300 times greater than the thermally conductivity of encapsulant 120. In some embodiments, thermally conductive material 204 has a thermal conductivity that is at least 300 to at least 400 times greater than the thermally conductivity of encapsulant 120. In some embodiments, thermally conductive material 204 has a thermal conductivity that is more than 400 times greater than the thermally conductivity of encapsulant 120. For example, in some embodiments, encapsulant 120 may have a thermal conductivity of less than 1 W/m·K to about 10 W/m·K, whereas thermally conductive material 204 may have a thermal conductivity within a range of about 200 W/m·K to about 600 W/m·K or about 300 W/m·K to about 500 W/m·K. In some embodiments, thermally conductive material 204 has a thermally conductivity that is greater than the thermal conductivity of pure silicon, which is approximately 150 W/m·K.

In some embodiments, thermally conductive material 204 may be a solid material, for example, in the form of pins or plugs that are sized to be contained in the one or more channels 202 and extend the length of the one or more channels 202. In some embodiments, thermally conductive material 204 may completely fill the one or more channels 202. In some embodiments, thermally conductive material 204 includes or consists of a pure metal or metal alloy. In some embodiments, thermally conductive material 204 includes or consists of pure copper or a copper alloy, for example. The copper or copper alloy may have a thermal conductivity greater than 300 W/m·K. In some embodiments, thermally conductive material 204 includes or consists of aluminum or an aluminum alloy. In some embodiments, the thermally conductive material 204 includes or consists of a precious metal or alloy thereof (e.g., silver or gold). In other embodiments, thermally conductive material 204 may be a non-metallic material preferably having a thermal conductivity greater than 150 W/m·K. In some embodiments, thermally conductive material 204 includes or consists of graphene, carbon nanotubes, diamond, and/or other forms of carbon. In yet other embodiments, thermally conductive material 204 may be in the form of a thermally conductive fluid, paste, grease, gel, or other flowable material.

In some embodiments, semiconductor device package 200 may include different sets of channels containing thermally conductive material, each set of channels being associated with a different heat-generating component. In some embodiments, for example, channels 202 form a first set of channels that extend towards IC die 102, while a second set of channels 206 are positioned in encapsulant 120 that extend toward one or more NAND dies 112. In some embodiments, channels 206 may have the same or similar dimensions as channels 202. In other embodiments, channels 206 may have different dimensions than channels 202. For example, while channels 202 may have lengths that extend from top surface 120a of encapsulant 120 to or into IC die 102 according to some embodiments, channels 206 may have shorter lengths. In some embodiments, channels 206 extend from top surface 120a of encapsulant 120 toward NAND dies 112, but terminate before reaching a surface of NAND dies 112. Thus, in some embodiments, channels 206 may each be separated from NAND dies 112, e.g., by a thin (e.g., less than 12 μm) layer of encapsulant 120. In some embodiments, channels 206 may each extend in a direction that is perpendicular or substantially perpendicular to top surface 120a of encapsulant 120. In some embodiments, channels 206 may each extend in a direction that is parallel or substantially parallel to channels 202.

According to some embodiments, each of channels 206 contains a thermally conductive material 208. Thermally conductive material 208 may be any of the materials described herein for thermally conductive material 204, for example, copper or copper alloy, etc. Thermally conductive material 208 may be selected to be the same material as thermally conductive material 204 according to some embodiments. In other embodiments, thermally conductive material 208 may be a different material than thermally conductive material 204. Preferably, each of thermally conductive material 204 and thermally conductive material 208 has a thermal conductivity greater than 150 W/m·K, for example, a thermal conductivity within a range of about 200 W/m·K to about 600 W/m·K, or about 300 W/m·K to about 500 W/m·K. In some embodiments, each of thermally conductive material 204 and thermally conductive material 208 has a thermal conductivity that is at least 300 W/m·K. In some embodiments, each of thermally conductive material 204 and thermally conductive material 208 has a thermal conductivity that is at least 350 W/m·K.

In yet further embodiments, semiconductor device package 200 may optionally include a surface treatment 210 on top surface 120a of encapsulant 120. Surface treatment 210 may be, for example, a coating or material layer applied on top surface 120a. The coating material may include a thermally conductive material, for example, any of the materials described herein for thermally conductive material 204. In some embodiments, surface treatment 210 includes a surface metallization treatment wherein top surface 120a is coated with a layer of metal (e.g., copper). In some embodiments, surface treatment 210 extends over ends of channels 202 and/or channels 206 such that, for example, thermally conductive material 204 and/or thermally conductive material 208 is in contact with surface treatment 210. In some embodiments, heat may be conducted away from the heat-generating components (e.g., IC die 102, NAND dies 112) through thermally conductive material 204 and/or thermally conductive material 208 to the surface treatment 210.

Figure 3A:
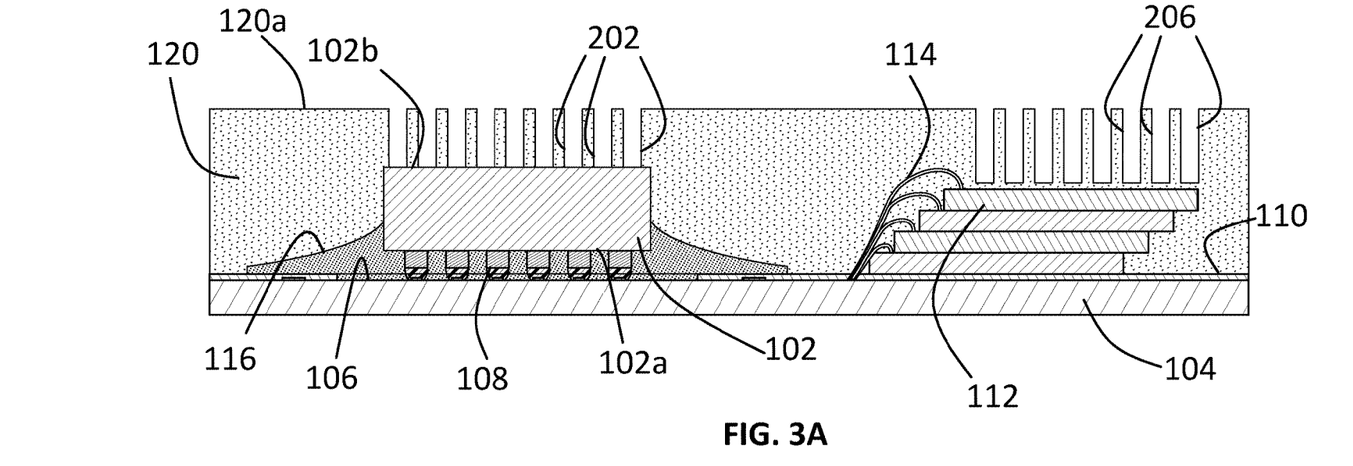
FIGS. 3A-3D are cross-sectional side views illustrating steps for assembling a semiconductor device package according to certain embodiments of the present disclosure.

Referring now to FIGS. 3A-3D, there are shown steps for making a semiconductor device package according to certain methods of the present disclosure. In FIG. 3A, a semiconductor device package is provided that, for example, may be configured the same as semiconductor device package 100 shown in FIG. 1. As further shown in FIG. 3A, one or more channels 202 are produced in encapsulant 120 that extend from top surface 120a of encapsulant 120 to the back side 102b of IC die 102. In some embodiments, the one or more channels 202 are drilled into encapsulant 120 through top surface 120a. In some embodiments, the one or more channels 202 may be laser etched into encapsulant 120. In further embodiments, one or more channels 206 are produced in encapsulant 120 that extend toward NAND dies 112. The one or more channels 206 may also be, for example, drilled or laser etched into encapsulant 120 in a manner similar to that used to produce channels 202. As discussed, in certain embodiments channels 206 do not extend all the way the way to NAND dies 112. Rather, channels 206 may be separated from NAND dies 112 by a thin (e.g., about 8-10 μm) layer of encapsulant 120. In some such embodiments, this separation may help protect NAND dies 112 since they may be relatively thin.

Figure 3B:
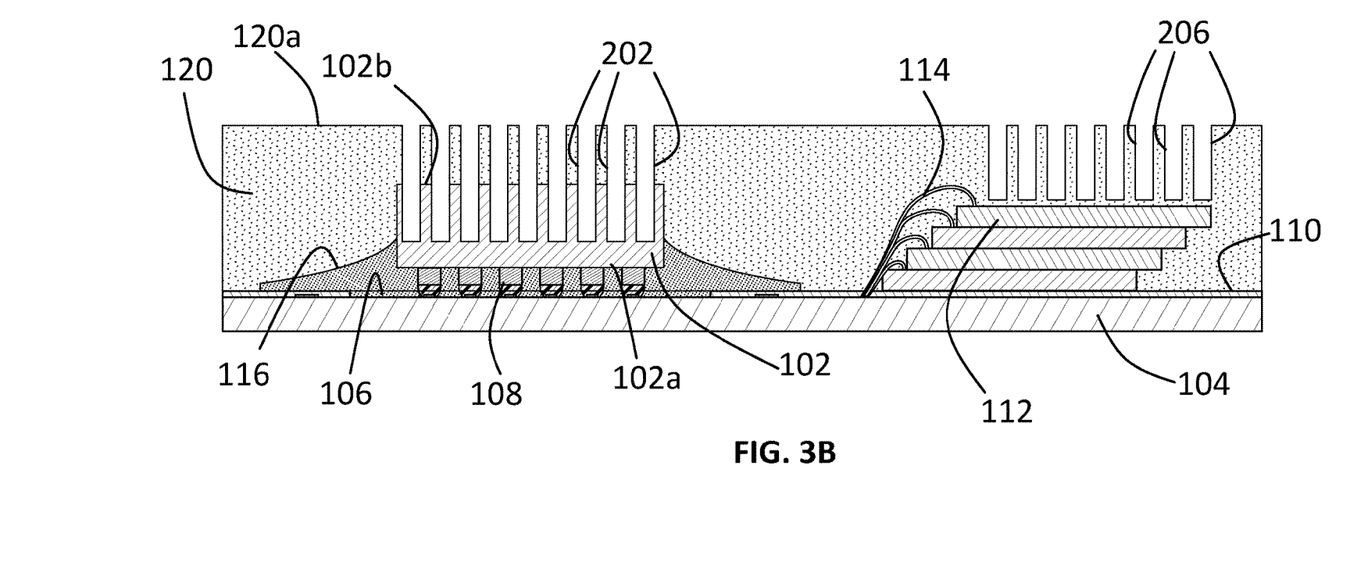

Referring now to FIG. 3B, in some embodiments, the one or more channels 202 may be extended into a portion of IC die 102. In some embodiments, IC die 102 is a silicon die having a thickness, for example, of about 75 μm to 100 μm or more. The thickness may be measured as a distance between active side 102a and back side 102b of IC die 102. Active side 102a of IC die 102 includes a functional layer containing circuitry that, in some embodiments, makes up less than a total thickness of IC die 102. In some embodiments, the functional layer makes up only a minority portion (e.g., less than 50%) of the total thickness of IC die 102. In some embodiments, for example, the functional layer of IC die 102 may be about 20 μm in thickness. Thus, in some embodiments, channels 202 may be extended into the remaining thickness of IC die 102 or a portion thereof to improve thermal dissipation without interfering with circuits of IC die 102. In some embodiments, channels 202 may be separated from the functional layer of IC die 102, e.g., by a distance of 1 μm to 10 μm or more, in order to avoid interfering with circuits of IC die 102. In some embodiments, since IC die 102 is made from a material (e.g., silicon) that is different than encapsulant 120, a different method for extending channels 202 into IC die 102 may be required. In some embodiments, reactive ion etching (ME) or other plasma etching technique may be used to etch into IC die 102 to extend channels 202 according to some examples.

In some embodiments, channels 202 are extended into IC die 102 through back side 102b of IC die 102. In some embodiments, channels 202 extend through less than the entire thickness of IC die 102. In some examples, channels 202 may extend into through back side 102b of IC die 102 to a depth of about or at least 1μm to at least 50 p.m. In some embodiments, channels 202 are extended into IC die 102 through back side 102b to a depth of up to 50 μm. In some embodiments, channels 202 extend through at least 5%, 10%, 15%, or 20% of the thickness of IC die 102. In some embodiments, channels 202 extend through about 1% to about 20% of the thickness of IC die 102. In some embodiments, channels 202 extend through about 20% to about 40% of the thickness of IC die 102. In some embodiments, channels 202 extend through about 40% to about 60% of the thickness of IC die 102. In some embodiments, channels 202 extend through more than 60% of the thickness of IC die 102. In some embodiments, channels 202 extend through up to 70% to 85% of the thickness of IC die 102. It is also envisioned that the channels 202, in some embodiments, could comprise through-silicon vias (TSVs) and thus extend all the way through IC die 102.

Figure 3C:
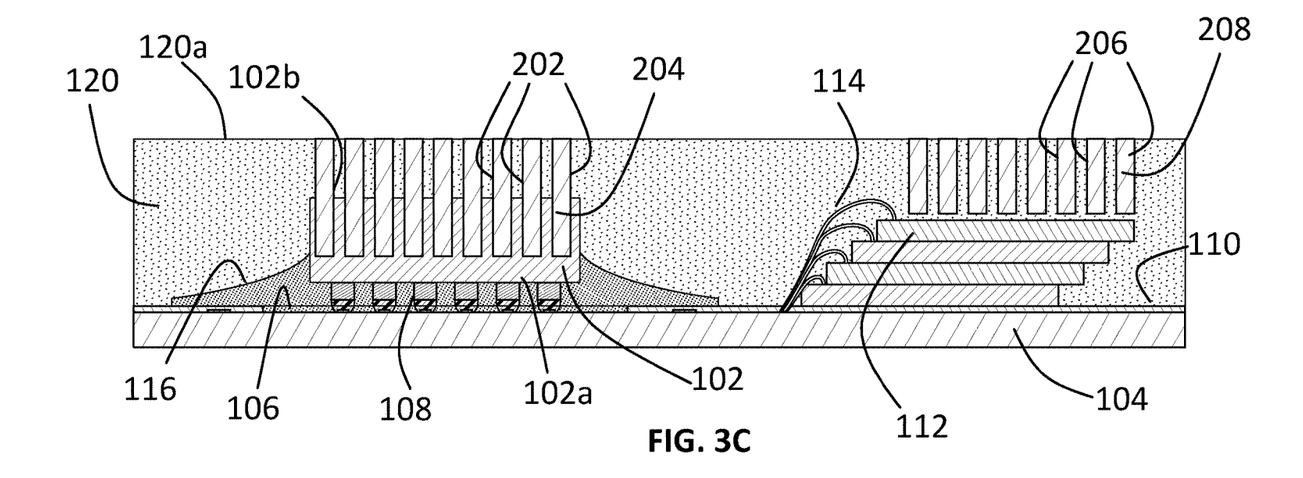

As illustrated in FIG. 3C, after channels 202 and/or channels 206 have been produced in encapsulant 120, thermally conductive materials 204 and 208 may be introduced according to some embodiments. In some embodiments, thermally conductive materials 204 and 208 may be the same or different materials as described herein. In some embodiments, thermally conductive material 204 and/or 208 includes a metal or metal alloy (e.g., copper or copper alloy). In some such embodiments, thermally conductive material 204 and/or 208 may be introduced into channels 202, 206 by an electroplating or other metal deposition process. In other embodiments, thermally conductive materials 204 and 208 may be formed into pins or plugs that are sized and configured to be inserted into channels 202, 206. In some embodiments, channels 202, 206 are completely or substantially filled by thermally conductive materials 204, 208. In some embodiments, thermally conductive material 204 physically contacts IC die 102, whereas thermally conductive material 208 does not physically contact NAND dies 112.

Figure 3D:
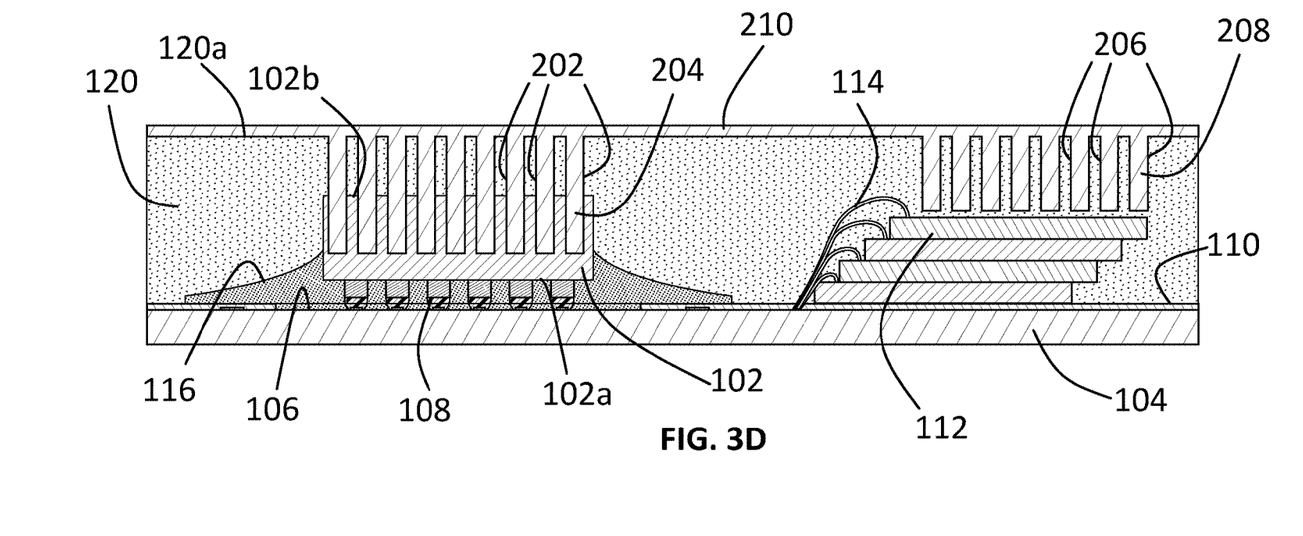

In further embodiments, after thermally conductive materials 204, 208 have be introduced into channels 202, 206, surface treatment 210 may optionally be applied onto top surface 120a of encapsulant 120 as shown in FIG. 3D, resulting in a semiconductor device package similar to semiconductor device package 200 of FIG. 2. As discussed, in some embodiments surface treatment 210 may be, for example, a coating or material layer applied on top surface 120a. The coating material may include a thermally conductive material, for example, any of the materials described herein for thermally conductive material 204. In some embodiments, the thermally conductive coating may help dissipate heat from the semiconductor device package to the surrounding environment. In some embodiments, surface treatment 210 is applied by metallization treatment wherein top surface 120a is coated with a layer of metal (e.g., copper, gold, silver, aluminum, or alloys thereof). In some embodiments, for example, surface treatment 210 is applied by an electroplating process. In some embodiments, surface treatment 210 is applied by a sputtering process or other physical vapor deposition (PVD) process. In some embodiments, surface treatment 210 extends over ends of channels 202 and/or channels 206 such that, for example, thermally conductive material 204 and/or thermally conductive material 208 is in contact with surface treatment 210. In some embodiments, heat may be conducted away from the heat-generating components (e.g., IC die 102, NAND dies 112) through thermally conductive material 204 and/or thermally conductive material 208 to the surface treatment 210.

Figure 4:
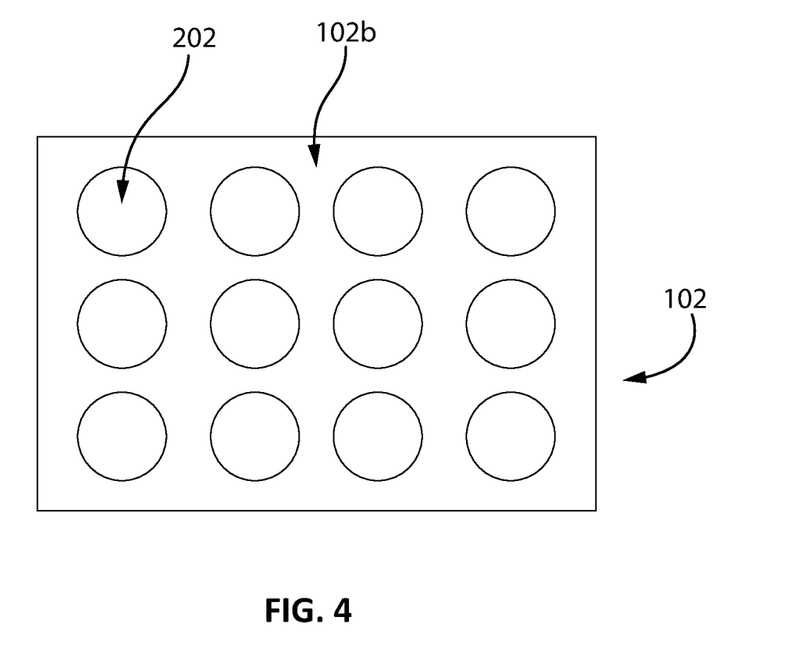
FIG. 4 is a plan view of a portion of an IC die showing the positioning of channels over a back side of the IC die according to one example embodiment.

FIG. 4 provides a plan view of a portion of IC die 102 showing the positioning of channels 202 over back side 102b according to one example embodiment. In some embodiments, at least 25%, at least 30%, at least 35%, at least 40%, at least 45%, at least 50%, at least 55%, at least 60%, at least 65%, or at least 70% of the area of back side 102a of IC die 102 may be covered by channels 202. In some embodiments, about 40% to about 70% of back side 102a of IC die 102 may be covered by channels 202. In the illustrated example, twelve channels 202 are arranged in an array of rows that are regularly distributed over the shown portion of IC die 102. It should be noted that the number and arrangement of channels 202 is not necessarily limited to the illustrated embodiment and that other arrangements are also possible. Fewer or more channels 202 may be included in other embodiments, and channels 202 need not be evenly or regularly spaced over IC die 102 according to certain embodiments. Furthermore, while each channel 202 is shown having a circular cross-sectional shape, other channels 202 may have other shapes (e.g., polygonal, square, rectangular, irregular, etc.).

It should be understood that various changes, substitutions, and alterations can be made herein without departing from the spirit and scope of the invention as defined by the appended claims. It should also be apparent that individual elements identified herein as belonging to a particular embodiment may be included in other embodiments of the invention. Moreover, the scope of the present application is not intended to be limited to the particular embodiments of the process, machine, manufacture, and composition of matter, means, methods and steps described in the specification. The scope of the invention also is not meant to be limited by the title or the abstract, as these parts of the application are provided to facilitate searching specific features disclosed herein. As one of ordinary skill in the art will readily appreciate from the disclosure, processes, machines, manufacture, composition of matter, means, methods, or steps, presently existing or later to be developed that perform substantially the same function or achieve substantially the same result as the corresponding embodiments described herein may be used according to the present disclosure.

What is claimed is:

1. A semiconductor device package, comprising:
    a substrate;
    a first heat-generating component positioned on a surface of the substrate, the first heat-generating component including contacts configured to make electrical contact with the substrate;
    an encapsulant at least partially encapsulating the first heat-generating component; and
    one or more channels extending through a portion of the encapsulant toward the first heat-generating component, each of the one or more channels containing a thermally conductive material having a thermal conductivity greater than a thermal conductivity of the encapsulant,
    wherein each of the one or more channels extends at least partially into the first heat-generating component.

2. The semiconductor device package of claim 1, wherein each of the one or more channels extends from a surface of the encapsulant.

3. The semiconductor device package of claim 1, wherein the thermally conductive material extends an entire length of the one or more channels and is in physical contact with the first heat-generating component.

4. The semiconductor device package of claim 1, wherein the thermally conductive material has a thermal conductivity greater than 150 W/m·K.

5. The semiconductor device package of claim 1, wherein the thermally conductive material comprises copper or a copper alloy.

6. The semiconductor device package of claim 1, wherein the first heat-generating component comprises an integrated circuit die having an active side facing the substrate and a back side opposite the active side.

7. The semiconductor device package of claim 6, wherein each of the one or more channels extends into the back side of the integrated circuit die through at least 10% of a thickness of the integrated circuit die.

8. The semiconductor device package of claim 1, further comprising a second heat-generating component positioned on the substrate.

9. The semiconductor device package of claim 8, wherein the one or more channels form a first set of channels, and wherein the semiconductor device package further comprises a second set of channels extending through a second portion of the encapsulant toward the second heat-generating component, each channel of the second set of channels containing a thermally conductive material having a thermal conductivity greater than a thermal conductivity of the encapsulant.

10. The semiconductor device package of claim 9, wherein each channel of the second set of channels is separated from the second heat-generating component.

11. The semiconductor device package of claim 1, further comprising a thermally conductive coating on a surface of the encapsulant, the thermally conductive coating being in contact with the thermally conductive material contained in the one or more channels.

12. A method for manufacturing a semiconductor device package, the method comprising:
    positioning an integrated circuit die on a substrate, the integrated circuit die having an active side facing the substrate and a back side opposite the active side;
    encapsulating the integrated circuit die with an encapsulant;
    etching or drilling one or more channels through a portion of the encapsulant, the one or more channels extending from a surface of the encapsulant to a surface of the integrated circuit die; and
    filling the one or more channels with a thermally conductive material having a thermal conductivity greater than a thermal conductivity of the encapsulant.

13. The method of claim 12, wherein the one or more channels extend from the surface of the encapsulant to the back side of the integrated circuit die.

14. The method of claim 13, further comprising etching the back side of the integrated circuit die to extend the one or more channels through a portion of the integrated circuit die prior to filling the one or more channels with the thermally conductive material.

15. The method of claim 14, further comprising coating the surface of the encapsulant with a thermally conductive coating, the thermally conductive coating being in contact with the thermally conductive material.

16. The method of claim 12, wherein the thermally conductive material comprises a metal or metal alloy, and filling the one or more channels with the thermally conductive material comprises electroplating the metal or metal alloy in the one or more channels.

17. A semiconductor device package, comprising:
- a substrate means for providing electrical interconnections;
- an integrated circuit die attached to a surface of the substrate means, wherein the integrated circuit die includes contact means for electrically connecting the integrated circuit die with the substrate means;
- an encapsulation means for at least partially encapsulating the integrated circuit die; and
- a first thermal conduction means for passively conducting heat generated by the integrated circuit die through the encapsulation means, the first thermal conduction means extending at least partially into the integrated circuit die.

18. The semiconductor device package of claim 17, further comprising a surface treatment means on a surface of the encapsulation means for dissipating heat from the semiconductor device package to a surrounding environment, the surface treatment means being in contact with the first thermal conduction means.

19. The semiconductor device package of claim 17, further comprising a memory die attached to the surface of the substrate means, and a second thermal conduction means for passively conducting heat generated by the memory die through the encapsulation means.

* * * * *